(12) United States Patent
De Weerdt et al.

(10) Patent No.: US 7,126,666 B2
(45) Date of Patent: Oct. 24, 2006

(54) LITHOGRAPHIC APPARATUS, DEVICE MANUFACTURING METHOD AND DEVICE MANUFACTURED THEREBY

(75) Inventors: Robrecht Emiel Maria Leonia De Weerdt, Hoogstraten (BE); Johannes Adrianus Antonius Theodorus Dams, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 42 days.

(21) Appl. No.: 10/839,712

(22) Filed: May 6, 2004

(65) Prior Publication Data
US 2005/0002008 A1  Jan. 6, 2005

(30) Foreign Application Priority Data
May 6, 2003  (EP) .................................. 03076395

(51) Int. Cl.
*G03B 27/42* (2006.01)
(52) U.S. Cl. ............................. 355/53; 355/72; 355/75; 250/548; 318/640; 318/649
(58) Field of Classification Search ...................... None
See application file for complete search history.

(56) References Cited

U.S. PATENT DOCUMENTS

| | | | |
|---|---|---|---|
| 5,699,621 A | 12/1997 | Trumper et al. ............. 33/1 M |
| 5,780,943 A | 7/1998 | Ono ........................... 310/90.5 |
| 5,847,480 A | 12/1998 | Post ........................... 310/90.5 |
| 6,147,421 A * | 11/2000 | Takita et al. .................. 310/12 |
| 2003/0052284 A1 | 3/2003 | Hol et al. .................... 250/548 |
| 2004/0160203 A1* | 8/2004 | Carter et al. ................ 318/114 |

FOREIGN PATENT DOCUMENTS

| | | | |
|---|---|---|---|
| EP | 1 001 512 A2 | 5/2000 |
| EP | 1 001 512 A3 | 2/2001 |
| EP | 1 265 105 A2 | 12/2002 |
| EP | 1 265 105 A3 | 1/2004 |

* cited by examiner

*Primary Examiner*—D. Rutledge
(74) *Attorney, Agent, or Firm*—Pillsbury Winthrop Shaw Pittman, LLP (57) ABSTRACT

A lithographic projection apparatus includes a passive magnetic bearing configured to provide support between a first and second part of the lithographic apparatus and allow both parts to be displaced relative to each other in a direction perpendicular to the support direction. The passive magnetic bearing includes first and second magnetic assemblies. Each magnetic assembly includes at least one permanent magnet.

16 Claims, 12 Drawing Sheets

LITHOGRAPHIC APPARATUS, DEVICE MANUFACTURING METHOD AND DEVICE MANUFACTURED THEREBY

This application claims priority to European Application 03076395.7, filed May 6, 2003, the entire contents of which are incorporated by reference.

BACKGROUND OF THE INVENTION

1. Field of the Invention

The present invention relates to a lithographic projection apparatus, a device manufacturing method and a device manufactured thereby.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). Examples of such patterning devices include a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such a device is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays as here referred to can be gleaned, for example, from U.S. Pat. Nos. 5,296,891 and 5,523,193, and PCT Patent Application Publications WO 98/3 8597 and WO 98/33096, which are incorporated herein by reference. In the case of a programmable mirror array, the support may be embodied as a frame or table, for example, which may be fixed or movable as required.

Another example of a patterning device is a programmable LCD array. An example of such a construction is given in U.S. Pat. No. 5,229,872, which is incorporated herein by reference. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning devices as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, both incorporated herein by reference.

Within a lithographic apparatus, bearings are often required between parts of the apparatus that provide support while allowing the parts to move relative to each other. A well known solution for realizing this movable support is an air bearing. The air bearing maintains the parts at a predefined distance by generating the appropriate bearing force. If a linear motor with a ferromagnetic core is used for driving both parts relative to each other, the normal force between the translator and the stator of the motor may be used as a pre-load force for the air bearing. An alternative to the use of an air bearing is to generate the required support by a linear motor or by a Lorentz type actuator. A drawback of an air bearing support is that it is difficult to provide such a system under vacuum conditions. A drawback of the linear motor or actuator support is that generation of the required bearing force results in a constant additional heat dissipation in the current carrying components of the linear motor or actuator.

SUMMARY OF THE INVENTION

It is an aspect of the present invention to provide a bearing that may be suitable for use in vacuum and dissipates substantially less heat than a bearing that uses a linear motor or an actuator for providing the bearing force.

This and other aspects are achieved according to the present invention in a lithographic apparatus including a radiation system configured to supply a beam of radiation; a support configured to support a patterning device, the patterning device configured to pattern the beam according to a desired pattern; a substrate table configured to hold a substrate; a projection system configured to project the patterned beam onto a target portion of the substrate; and a bearing configured to support a first part of the apparatus with respect to a second part of the apparatus in a first direction such that the first part is movable relative to the second part, wherein the bearing includes a passive magnetic bearing.

A bearing force that is substantially provided by a passive magnetic bearing and not by current carrying coils provides a more efficient support compared to linear motor or actuator type bearings, yielding a reduced power supply for the apparatus and less heat dissipation inside the apparatus. The latter is beneficial as thermal stability of a lithographic apparatus is desirable.

In an exemplary embodiment of the present invention, the first part of the lithographic apparatus is supported by the second part in a first direction such that the first part is movable with respect to the second part in a second direction substantially perpendicular to the first direction.

According to another exemplary embodiment of the present invention, a support having a low stiffness in the support direction is provided by the arrangement of the magnetic assemblies. A low stiffness bearing is more desirable than a higher stiffness bearing because the transmission of vibrations from one part of the bearing to the other is reduced. It should be appreciated that 'a permanent magnet' may be considered equivalent to an array of individual permanent magnets having the same magnetic polarization placed adjacent to each other.

According to yet another exemplary embodiment of the present invention, an arrangement of magnetic assemblies provides a comparatively large stroke in the second direction along which the first and second parts can be displaced relative to each other without any substantial variation of the bearing force.

According to a further exemplary embodiment of the present invention, an arrangement of magnetic assemblies provides a lower stiffness in the first direction.

According to a still further exemplary embodiment of the present invention, an arrangement of magnetic assemblies provides a bearing having a low stiffness along the first direction, the second direction, and a third direction perpendicular to both first and second directions. Low stiffness in three directions enables control of the magnet bearing (i.e. maintaining a relative position between the first and second parts in the first and third direction) to be executed with minimal effort by, for example, Lorentz type actuators or linear motors.

According to an even further exemplary embodiment of the present invention, an arrangement of magnetic assemblies provides a low stiffness in all three directions.

According to another exemplary embodiment of the present invention, an arrangement of magnetic assemblies provides an increased bearing force that can be obtained due to an increased number of magnets. The required bearing force can also be more evenly distributed. Extending the magnetic assemblies in the third direction results in a more stable bearing with respect to tilt around the second direction.

According to yet another exemplary embodiment of the present invention, an arrangement of magnetic assemblies results in a more stable bearing with respect to tilt around the third direction because the bearing force is generated as the sum of contributions of the different magnets to this bearing force.

According to an even further exemplary embodiment of the present invention, an arrangement of magnetic assemblies in which the relative position of at least two or more permanent magnets of at least one of the magnetic assemblies is adjustable allows flexible use of the bearing (e.g. for different loads) and also allows for compensation of mechanical or magnetic tolerances of the magnetic assemblies. The magnets whose relative position is adjustable can be of equal size or of different size.

According to another exemplary embodiment of the present invention, an arrangement of the magnetic assemblies is such that first and second magnetic assemblies can rotate relative to each other instead of allowing a linear displacement.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Exemplary embodiments of the present invention will now be described, by way of example only, with reference to the accompanying schematic drawings in which corresponding reference symbols indicate corresponding parts, and in which:

FIG. 2b schematically depicts a side view of the first embodiment of FIG. 2a;

FIG. 2c schematically depicts the magnetic field lines calculated for the passive magnetic bearing as shown in FIG. 2a;

FIG. 3b schematically depicts a bottom view of the bearing of FIG. 3a;

FIG. 3c schematically depicts the magnetic field lines calculated for the passive magnetic bearing of FIG. 3a;

FIG. 4b schematically depicts a bottom view of the bearing of FIG. 4a;

FIG. 4c schematically depicts the magnetic field lines calculated for the passive magnetic bearing of FIG. 4a;

FIG. 5b schematically depicts a bottom view of the bearing of FIG. 5a;

FIG. 5c schematically depicts the magnetic field lines calculated for a part of the passive magnetic bearing of FIG. 5a;

FIG. 5d schematically depicts connecting an object table to bearing of FIG. 5a;

FIG. 6b schematically depicts the magnetic field lines calculated for the passive magnetic bearing of FIG. 6a;

FIG. 9b schematically depicts a top view of the passive magnetic bearing of FIG. 9a;

FIG. 9c schematically depicts an actuator arrangement provided between both parts of the passive magnetic bearing of FIG. 9a;

FIG. 11b schematically depicts a top view of the bearing of FIG. 11a.

DETAILED DESCRIPTION

Figure 1:
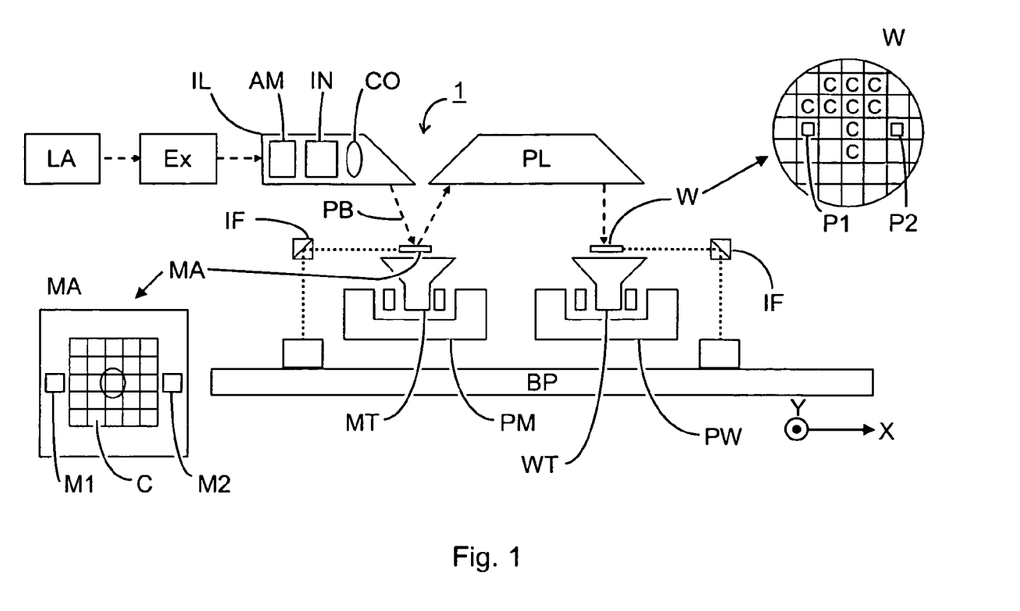
FIG. 1 schematically depicts a lithographic projection apparatus according to the present invention.

FIG. 1 schematically depicts a lithographic projection apparatus 1 according to an exemplary embodiment of the present invention. The apparatus includes a radiation system Ex, IL configured to supply a beam PB of radiation (e.g. UV or EUV radiation). The radiation system also includes a radiation source LA. A first object table (mask table) MT is provided with a mask holder configured to hold a mask MA (e.g. a reticle) and is connected to a first positioning device PM that accurately positions the mask with respect to a projection system ("lens")PL. A second object table (substrate table) WT is provided with a substrate holder configured to hold a substrate W (e.g. a resist-coated silicon wafer) and is connected to a second positioning device PW that accurately positions the substrate with respect to the projection system PL. The projection system PL (e.g. a refractive or catadioptric system, a mirror group or an array of field deflectors) is configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type (i.e. has a reflective mask). Alternatively, the apparatus may employ another kind of patterning device, such as a programmable mirror array of a type as referred to above.

The source LA (e.g. an excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioning device(s), for example a beam expander Ex. The illuminator IL may include an adjusting device(s) AM configured to set the outer and/or inner radial extent (commonly referred to as σ-outer and σ-inner, respectively) of the intensity distribution in the beam. In addition, it will generally include various other components, for example an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus. The radiation which it produces may be led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM (and interferometric measuring device IF) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:
1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB; and
2. In scan mode, essentially the same scenario applies, except that a given target portion C is not exposed in a single "flash". Instead, the mask table MT is movable in a given direction (the "scanning direction", e.g. the Y direction) with a speed v, so that the beam PB is caused to scan over a mask image. Concurrently, the substrate table WT is simultaneously moved in the same or opposite direction at a speed V=Mv, in which M is the magnification of the projection system PL (e.g., M=¼ or ⅕). In this manner, a relatively large target portion C can be exposed, without having to compromise on resolution.

Figure 2A:
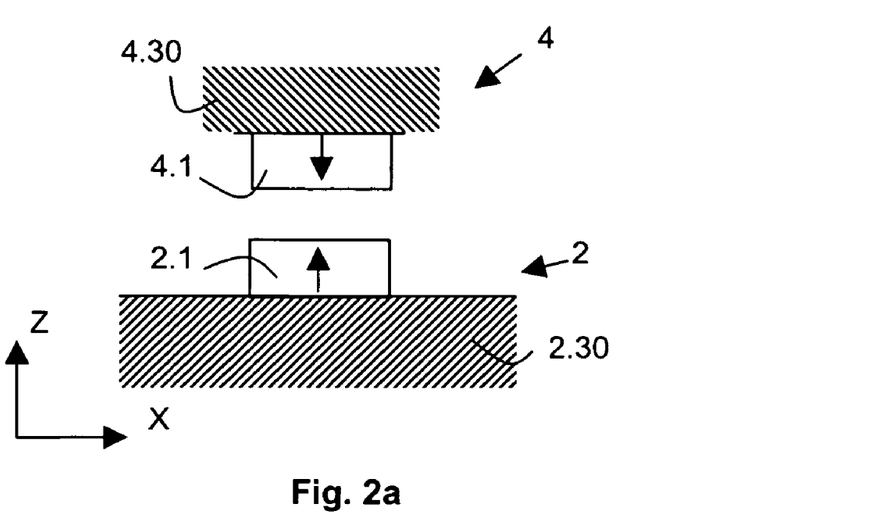
FIG. 2a schematically depicts a front view of a passive magnetic bearing according to the present invention.
Figure 2B:
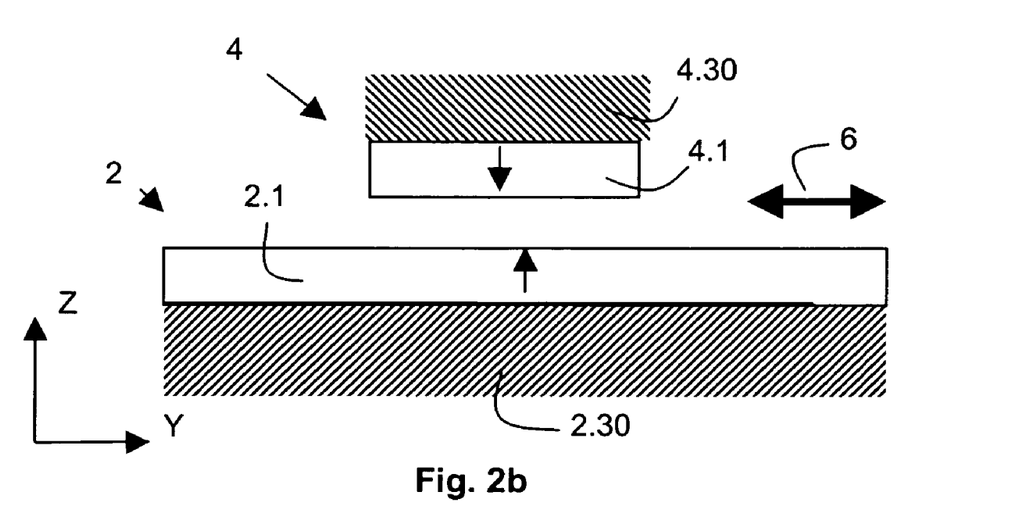

FIGS. 2a and 2b show an arrangement of permanent magnets according to an exemplary embodiment of a bearing according to the present invention. FIG. 2a shows a front view and FIG. 2b shows a side view. In this arrangement, the first magnetic assembly 2 includes a magnet 2.1 arranged on a first part 2.30 of the lithographic apparatus and a second magnetic assembly 4 including a magnet 4.1 arranged on a second part 4.30 of the lithographic apparatus. The first and second parts 2.30 and 4.30 can move relative to each other as indicated by the arrow 6. This can be done, for example, by an electromagnetic motor positioned between the first and second parts 2.30 and 4.30.

The arrows inside the magnets 2.1 and 4.1 indicate the magnetic polarization of the magnets. This particular arrangement of magnets produces a repelling magnetic force between the first and second parts 2.30 and 4.30 in the Z-direction. As can be seen in FIG. 2b, both magnetic assemblies 2 and 4 can be displaced relative to each other in the Y-direction. Because the first magnetic assembly 2 is substantially longer in the Y-direction than the second magnetic assembly 4, the magnetic force exerted between both magnetic assemblies 2 and 4 is substantially independent of the Y-position of the second magnetic assembly 4, i.e. a low stiffness in the Y-direction is encountered. The stiffness in the X-direction and the Z-direction however, is rather high in this arrangement of magnets. Therefore, a significant force variation is encountered when the first and second parts 2.30 and 4.30 are displaced relative to each other in the X-direction or in the Z-direction. It should be noted that in order to maintain the first part 2.30 in the appropriate position relative to the second part 4.30 (e.g. in the Z-direction, the X-direction or both), one or more actuators (such as Lorentz actuators) may be positioned between the first and second parts 2.30 and 4.30. Such actuators may also be provided to prevent the moving part (e.g. part 2.30) from tilting around the X, Y or Z-axis.

Figure 2C:
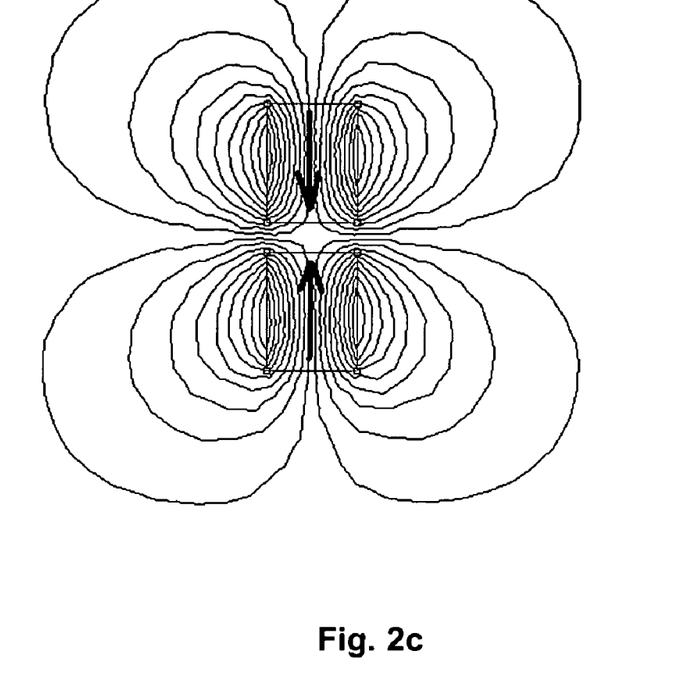

FIG. 2c shows the magnetic field lines calculated for this particular arrangement of permanent magnets. As can be seen from FIG. 2c, each of the magnetic field lines remains within one of the magnetic assemblies. None of the field lines connects one of the magnets of the first magnetic assembly with one of the magnets of the second magnetic assembly.

Figure 3A:
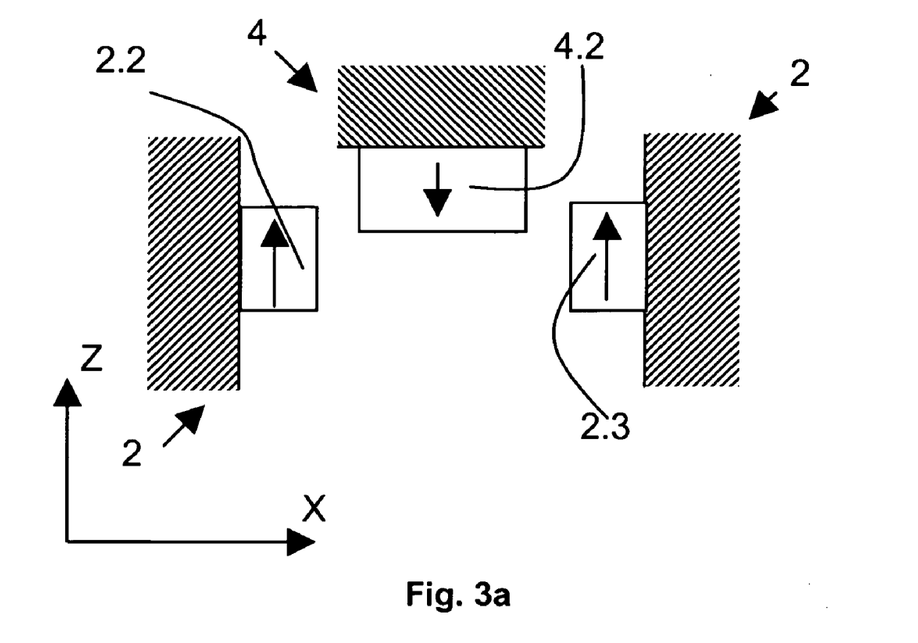
FIG. 3a schematically depicts a front view of a passive magnetic bearing according to the present invention.
Figure 3B:
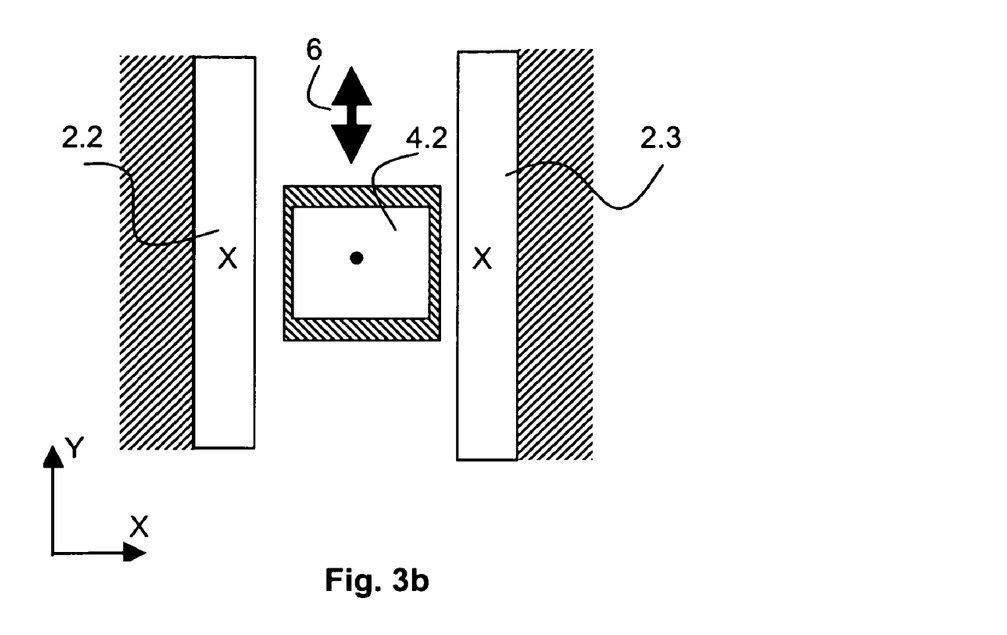
Figure 3C:
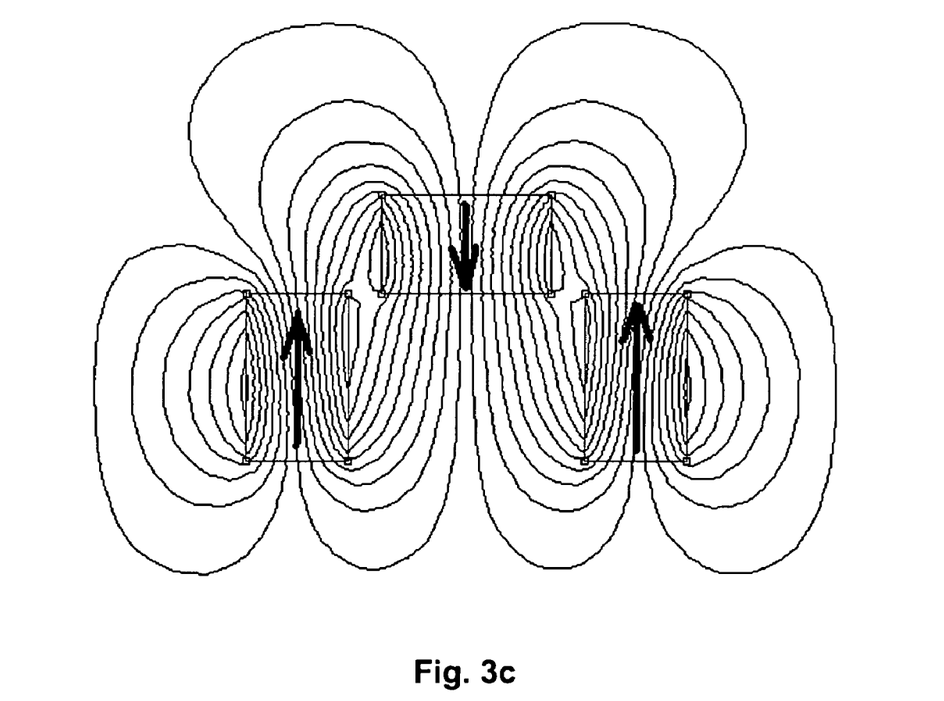

FIGS. 3a and 3b show another arrangement of permanent magnets according to an exemplary embodiment of the present invention. FIG. 3a shows a front view and FIG. 3b shows a bottom view. In this arrangement, the first magnetic assembly 2 includes two magnets 2.2, 2.3 arranged on a first part of the lithographic apparatus and a second magnetic assembly 4 including a magnet 4.2 arranged on a second part of the lithographic apparatus. The first and second parts can move relative to each other as indicated by the arrow 6. In this arrangement, a lower stiffness is obtained in the Z-direction compared to the arrangement shown in FIGS. 2a–c. This lower stiffness is obtained by arranging both magnetic assemblies in such a way that a repelling force is generated between both assemblies wherein, different from the situation depicted in FIG. 2c, a substantial part of the magnetic field lines of both assemblies connect both magnets 2.2 and 2.3 of the first assembly 2 with the magnet 4.2 of the second assembly 4. This situation is depicted in FIG. 3c showing the magnetic field lines calculated for the configuration shown in FIG. 3a. This is supported by extensive simulations showing that a low stiffness in the support direction can be obtained by the following measures:
1. The magnet assemblies are arranged to repel from each other in the support direction.
2. A substantial portion of the magnetic field lines connects a magnet from the first assembly with a magnet from the second assembly.

It is desirable that at least 20% of the magnetic field lines connect a magnet from the first assembly with a magnet from the second assembly to obtain a comparatively small operating area wherein a low stiffness is encountered. For practical embodiments, it is desirable that at least 50% of the magnetic field lines should connect a magnet from the first assembly with a magnet from the second assembly to obtain an increased operating area wherein a low stiffness is encountered. An increased percentage of magnetic field lines connecting a magnet from the first assembly with a magnet of the second assembly results in an increased reduction of the stiffness of the bearing. Also in this exemplary embodiment, the first part can be maintained in the appropriate position relative to the second part by applying one or more actuators, for example Lorentz actuators, between the first and second parts. As an alternative, the electromagnetic motor to displace the first part relative to the second part in the Y-direction may also be equipped to generate a force between the first and second parts in one or more additional degrees of freedom, i.e. apart from the force generated in the Y-direction. As an example, the electromagnetic motor may be a planar motor capable of displacing both parts relative to each other in all six degrees of freedom. In such an arrangement, the planar motor may drive both parts relative to each other in the Y-direction while maintaining both parts in a predefined position relative to each other in the other five degrees of freedom. Combining the passive magnetic bearing with a planar motor will result in an improved efficiency of the planar motor since the weight of the moving part is compensated by the permanent magnet bearing.

Figure 4A:
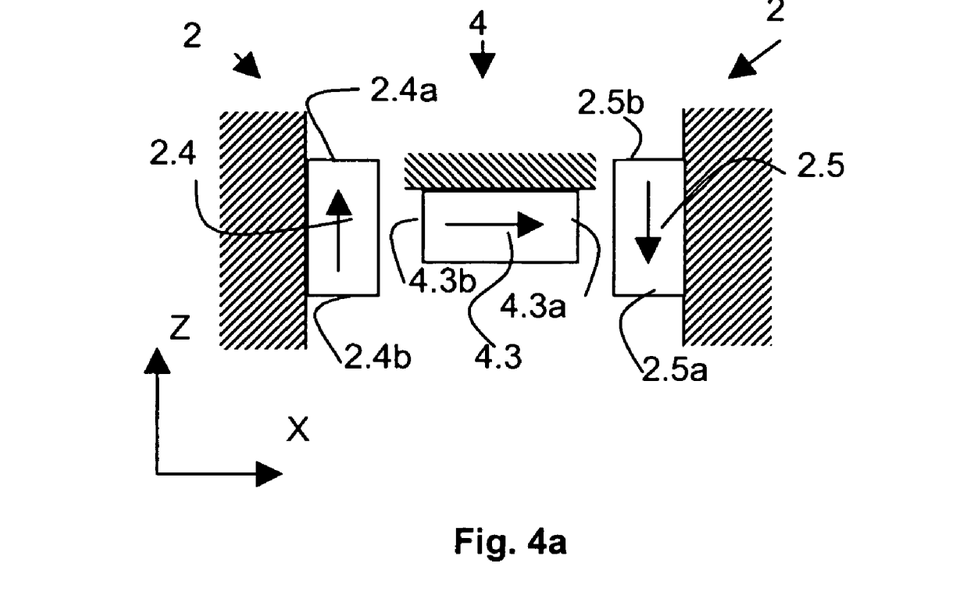
FIG. 4a schematically depicts a front view of a passive magnetic bearing according to the present invention.
Figure 4B:
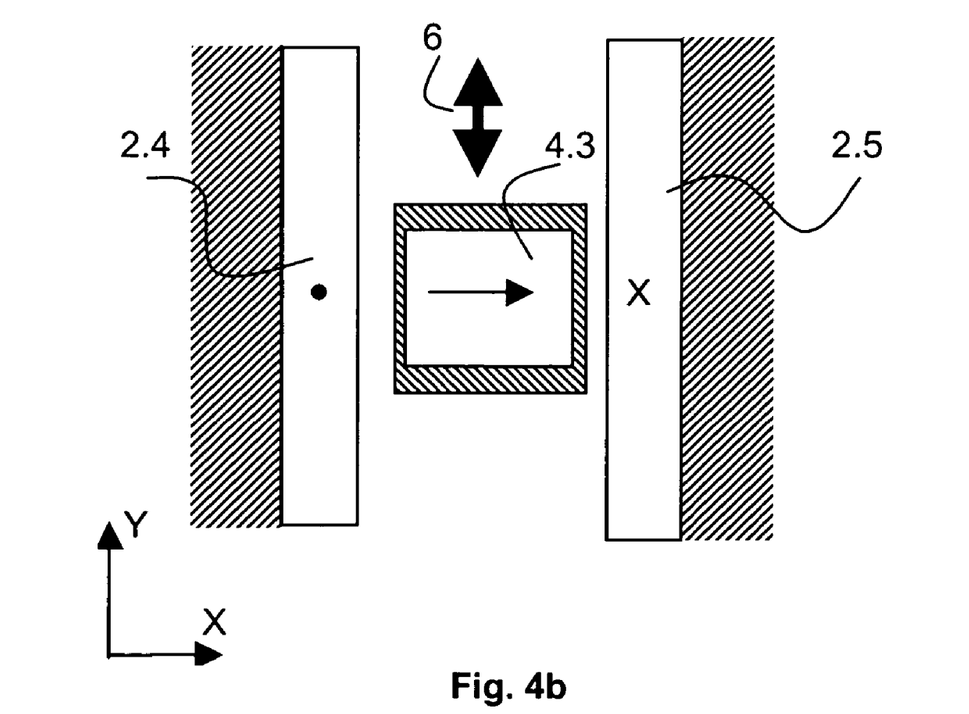
Figure 4C:
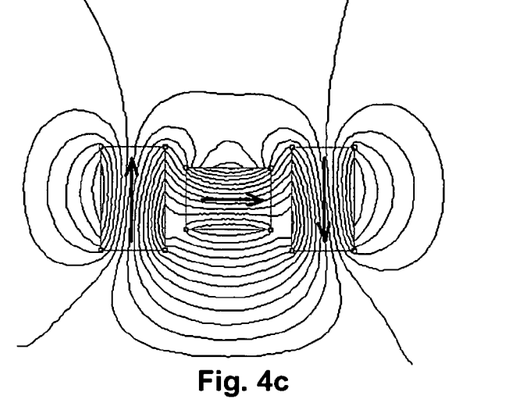

FIGS. 4a and 4b show another arrangement of permanent magnets according to an exemplary embodiment of the present invention. FIG. 4a shows a front view and FIG. 4b shows a bottom view. In this configuration, the first magnetic assembly 2 includes two magnets 2.4, 2.5 arranged on a first part of the lithographic apparatus and a second magnetic assembly 4 including a magnet 4.3 arranged on a second part of the lithographic apparatus. The first and second parts can move relative to each other as indicated by the arrow 6. In this arrangement, the stiffness obtained in the Z-direction is even further reduced compared to the configuration shown in FIG. 2a–c. The bearing force generated between both magnetic assemblies 2 and 4 is a repelling force in the Z-direction. This repelling force is generated by the attraction between poles of different polarity (between poles 2.4b and 4.3a and between 2.5a and 4.3b) and the repulsion between poles of the same polarity (between poles 2.4a and 4.3a and between poles 2.5b and 4.3b). In this situation, when first and second part of the lithographic apparatus are displaced relative to each other in the Z-direction one of the attraction or repulsion will increase while the other will decrease resulting in a comparatively small variation of the resulting force. FIG. 4c shows the calculated magnetic field lines for the magnet arrangement shown in FIG. 4a. As is shows in FIG. 4c, a substantial portion of the magnetic field lines of this arrangement of magnets connects a magnet from the first assembly with a magnet from the second assembly.

Figure 5A:
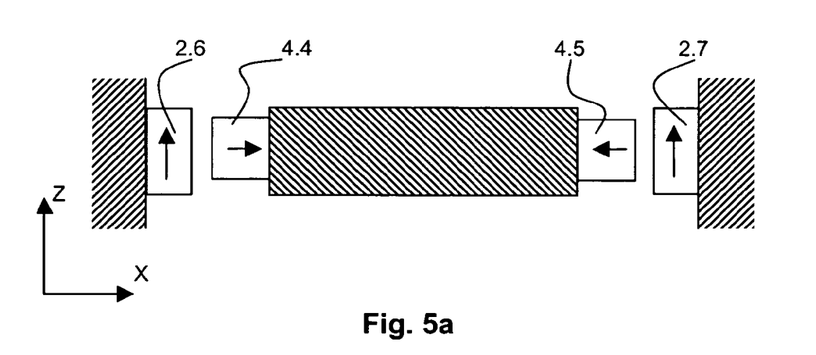
FIG. 5a schematically depicts a front view of a passive magnetic bearing according to the present invention.
Figure 5B:
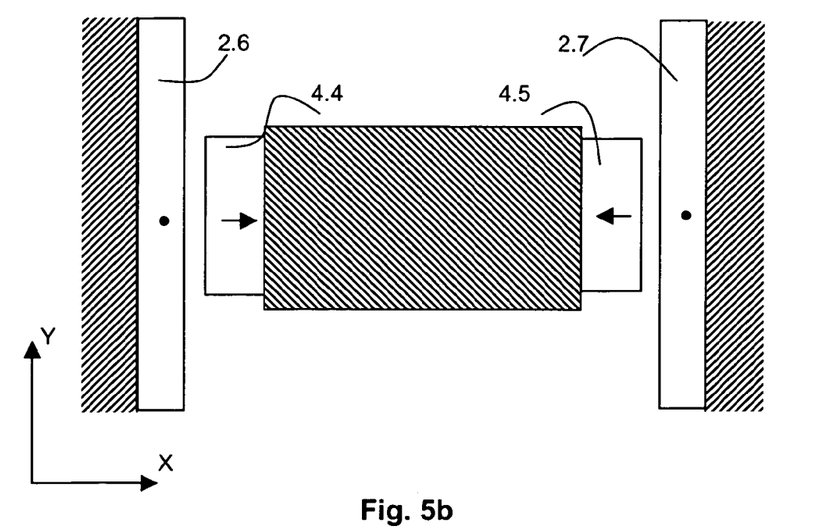
Figure 5C:
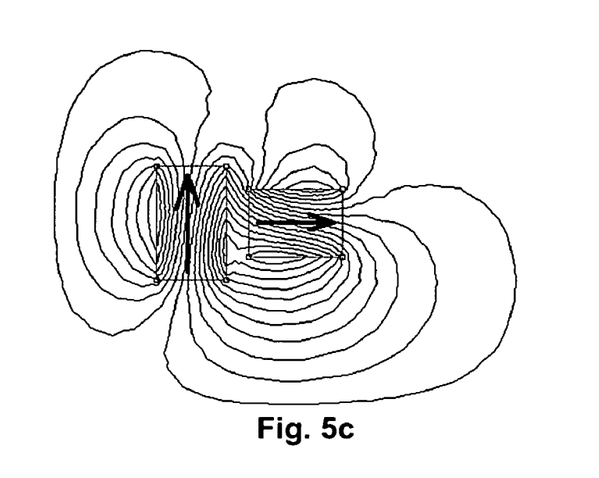
Figure 5D:
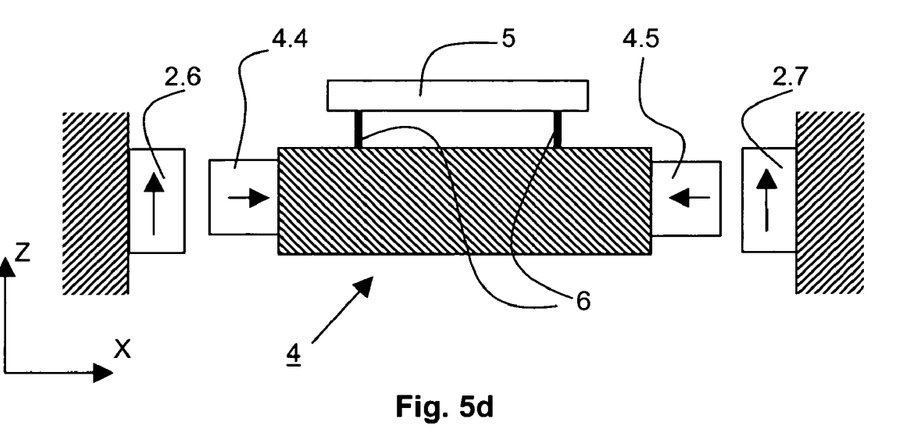

FIGS. 5a and 5b show another arrangement of permanent magnets according to an exemplary embodiment of the present invention. FIG. 5a shows a front view and FIG. 5b shows a top view of the arrangement. In this arrangement, a first magnetic assembly 2 includes two magnets 2.6, 2.7 arranged on a first part of the lithographic apparatus and a second magnetic assembly 4 includes two magnets 4.4, 4.5 arranged on a second part of the lithographic apparatus. FIG. 5c shows the calculated magnetic field lines for part of the magnetic assemblies of FIG. 5a (the magnetic field of magnets 2.6 and 4.4 is calculated). Since the magnetic field lines shown in FIG. 5c connect the magnet 2.6 of the first assembly with the magnet 4.4 of the second assembly, also in this arrangement, a low stiffness between both assemblies is obtained. FIG. 5d schematically depicts an object table 5 (e.g. a mask table) connected to the second magnetic assembly 4 of the bearing arrangement. Such a connection can, for example, be accomplished by leaf springs 6. The object table 5 may also be connected directly to the second magnetic assembly 4. In order to increase the positioning accuracy of the object table, an actuator system may be provided between the object table 5 and the bearing assembly. Such an actuator system may, for example, include electromagnetic actuators such as Lorentz actuators or reluctance actuators or piezo-electric actuators. Similar arrangements to connect the object table to the bearing assembly or to position the object table can also be made with the bearing arrangements shown in FIGS. 2a–4c and 6a–10.

Figure 6A:
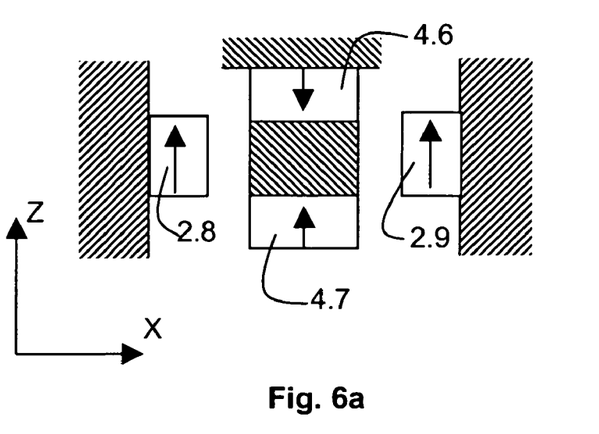
FIG. 6a schematically depicts a front view of a passive magnetic bearing according to the present invention.
Figure 6B:
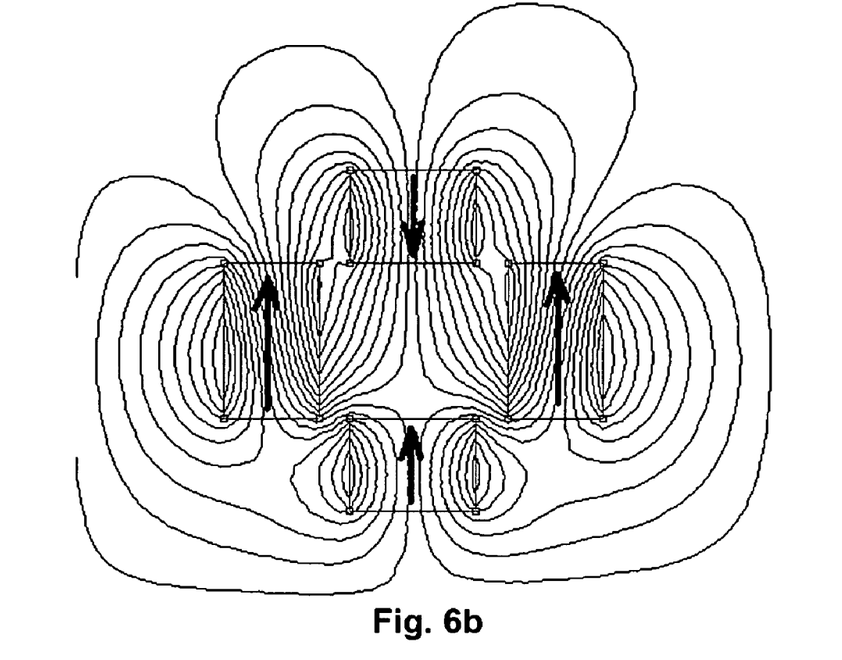

FIGS. 6a and 6b show a front view of another arrangement of permanent magnets according to an exemplary embodiment of the present invention. In this configuration, the first magnetic assembly includes two magnets 2.8, 2.9 arranged on a first part of the lithographic apparatus and a second magnetic assembly 4 includes two magnets 4.6, 4.7 arranged on a second part of the lithographic device. In this arrangement, all magnets have their magnetization parallel or anti-parallel to each other. Also in this arrangement, low stiffness is obtained. As can be seen from FIG. 6b showing the calculated magnetic field lines, a substantial part of the magnetic field lines connects the surface of a magnet from the first assembly with a magnet from the second assembly.

Figure 7:
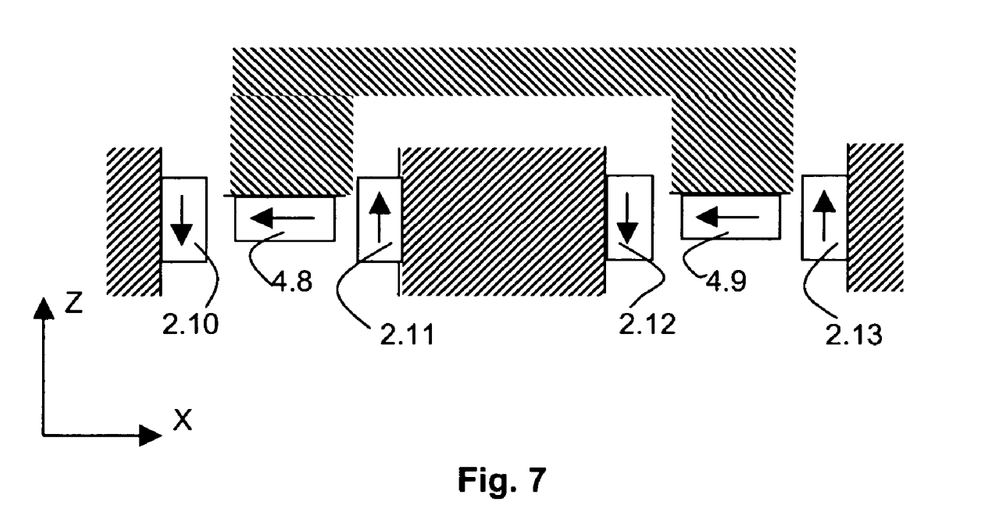
FIG. 7 schematically depicts a front view of a passive magnetic bearing according to the present invention.

FIG. 7 shows another exemplary embodiment of the present invention where two magnet arrangements according to FIGS. 3a–c are combined.

Figure 8:
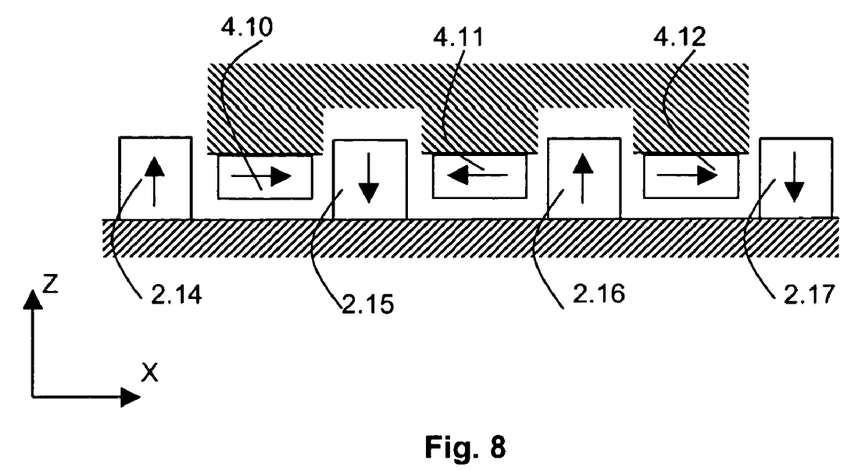
FIG. 8 schematically depicts a front view of a passive magnetic bearing according to the present invention.
Figure 9A:
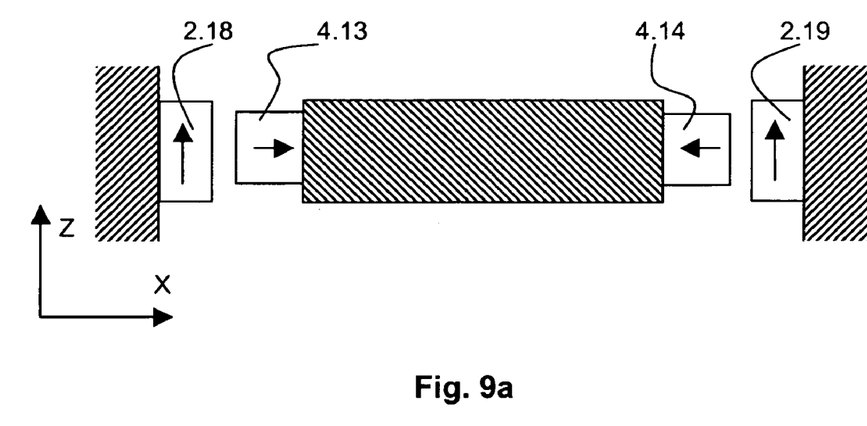
FIG. 9a schematically depicts a front view of a passive magnetic bearing according to the present invention.
Figure 9B:
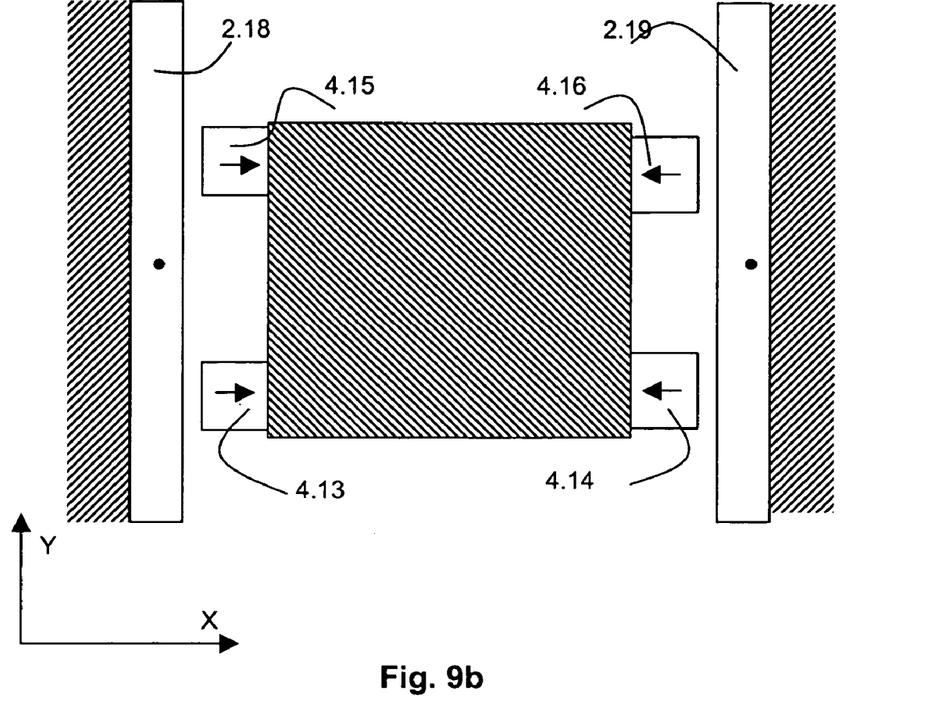
Figure 9C:
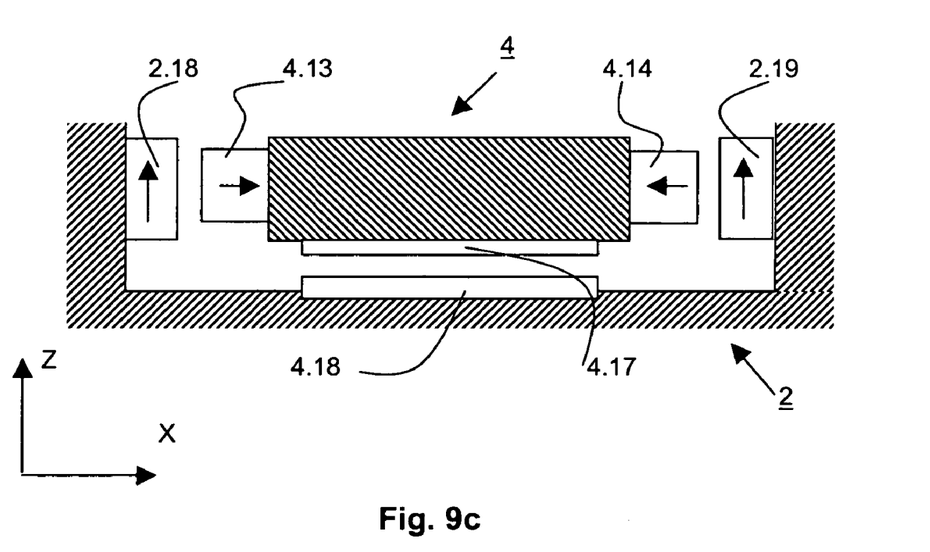

FIG. 8 shows another exemplary embodiment of the present invention that can be constructed by combining magnet configurations shown in previous figures. It should be appreciated that the magnetic assemblies as shown can be extended even further in X-direction if required. The magnetic assemblies as shown in FIGS. 7 and 8 provide a more stable configuration with respect to tilting around the Y-axis. Combining a plurality of configurations can also be done in Y-direction to obtain an increased bearing force or provide a more evenly distributed bearing force as shown in FIGS. 9a and 9b. FIGS. 9a and 9b combine two configurations according to FIGS. 4a–c into one assembly. In this case, the required bearing force is provided as the sum of the force in the Z-direction acting on the four magnets 4.13, 4.14, 4.15 and 4.16. This assembly provides a more stable arrangement with respect to tilting of the second magnet assembly around the X-axis. In FIG. 9c, the bearing arrangement is combined with an actuator arrangement. The actuator arrangement is schematically illustrated by elements 4.17 and 4.18. Element 4.17 may, for example, include a magnet array that cooperates with a coil assembly 4.18. The magnet assembly 4 may be displaced relative to the magnet assembly 2 in one or more degrees of freedom by the actuator arrangement. In general, the actuator assembly may includes a linear motor or a planar motor to displace both assemblies 2 and 4 relative to each other over comparatively large distances and may further include electromagnetic actuators such as Lorentz actuators or reluctance actuators to position both assemblies relative to each other over comparatively small distances in the other degrees of freedom. Similar actuator arrangements may be combined with the bearing arrangements of FIGS. 2a–10. The mask table, or the object table, that requires accurate positioning may be directly coupled to the second magnetic assembly 4, for example by leaf springs. In case the positioning accuracy of the bearing assembly and actuator assembly is not sufficient, an additional actuator arrangement (a so-called short stroke actuator system) may be applied between the object table and the bearing arrangement. Such an arrangement is schematically depicted in FIG. 9d.

Figure 9D:
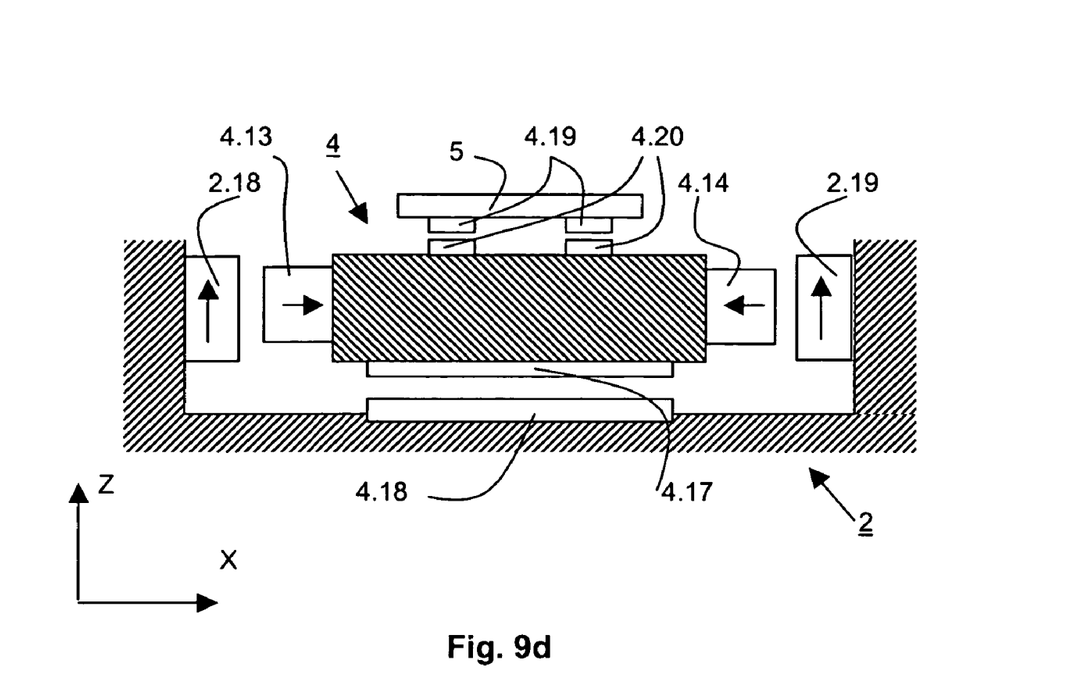
FIG. 9d schematically depicts a short stroke actuator system provided between an object table and the passive magnetic bearing.

FIG. 9d schematically depicts a short stroke actuator system arranged between the object table 5 and the magnetic assembly 4 of the magnetic bearing. In such an arrangement, the coarse positioning of the magnetic assembly 4 may be provided by the actuator system 4.17, 4.18 while the short stroke actuator system 4.19, 4.20 can be applied for accurate positioning of the object table 5. The short stroke actuator system may, for example, include a plurality of Lorentz actuators, each including a magnet array 4.19 and a coil assembly 4.20.

Figure 10:
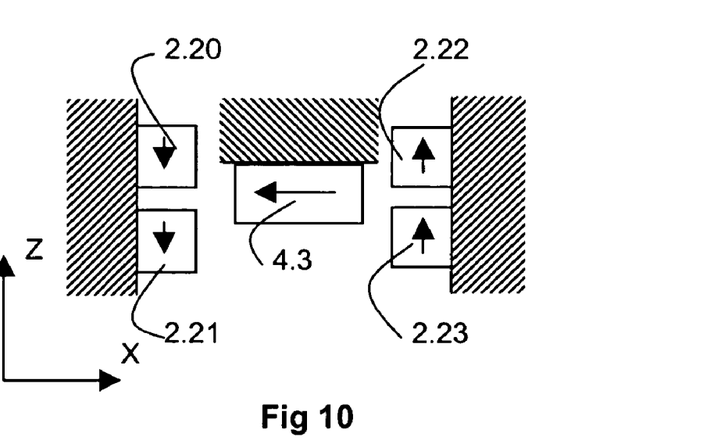
FIG. 10 schematically depicts a front view of a passive magnetic bearing according to the present invention.

FIG. 10 shows another exemplary embodiment of the present invention wherein the first magnetic assembly 2 includes four magnets 2.20, 2.21, 2.22, and 2.23. The distance in the Z-direction between the magnets 2.20 and 2.21 and between the magnets 2.22 and 2.23 is adjustable in order to adjust the bearing force. The arrangement shown in FIG. 10 has the same performance with respect to stiffness as the arrangement shown in FIGS. 4a–c. Subdividing each of the magnets 2.4 and 2.5 of the arrangement shown in FIGS. 4a–c into two magnets with the same polarization and displacing them relative to each other in Z-direction results in the arrangement shown in FIG. 10. Subdividing the magnets of one or both of the magnet assemblies in order to make the bearing force adjustable can be applied to all of the arrangements of the present invention. In general, if at least one of the magnet assemblies is provided with at least two magnets and the distance between those magnets is adjustable, the bearing force can be adjusted. For example, the bearing force generated by the arrangement shown in FIGS. 3a–c can be adjusted by displacing magnets 2.2 and 2.3 relative to each other in the X-direction. As an other example, the magnets 4.6 and 4.7 in the arrangement shown in FIGS. 6a–b can be used for adjusting the bearing force if the distance between both arrays is adjustable.

For all the arrangements shown in FIGS. 2a–10, a similar performance can be obtained when the second magnetic assembly is substantially longer than the first magnetic assembly in the Y-direction instead of the first magnetic assembly being longer than the second magnetic assembly.

Figure 11A:
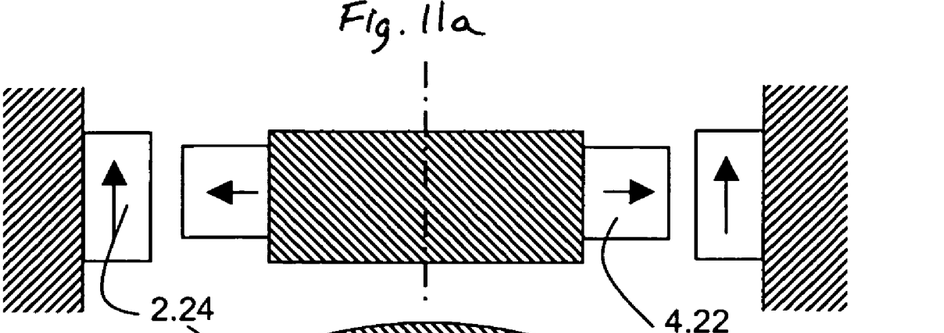
FIG. 11a schematically depicts a front view of a passive magnetic bearing according to the present invention.
Figure 11B:
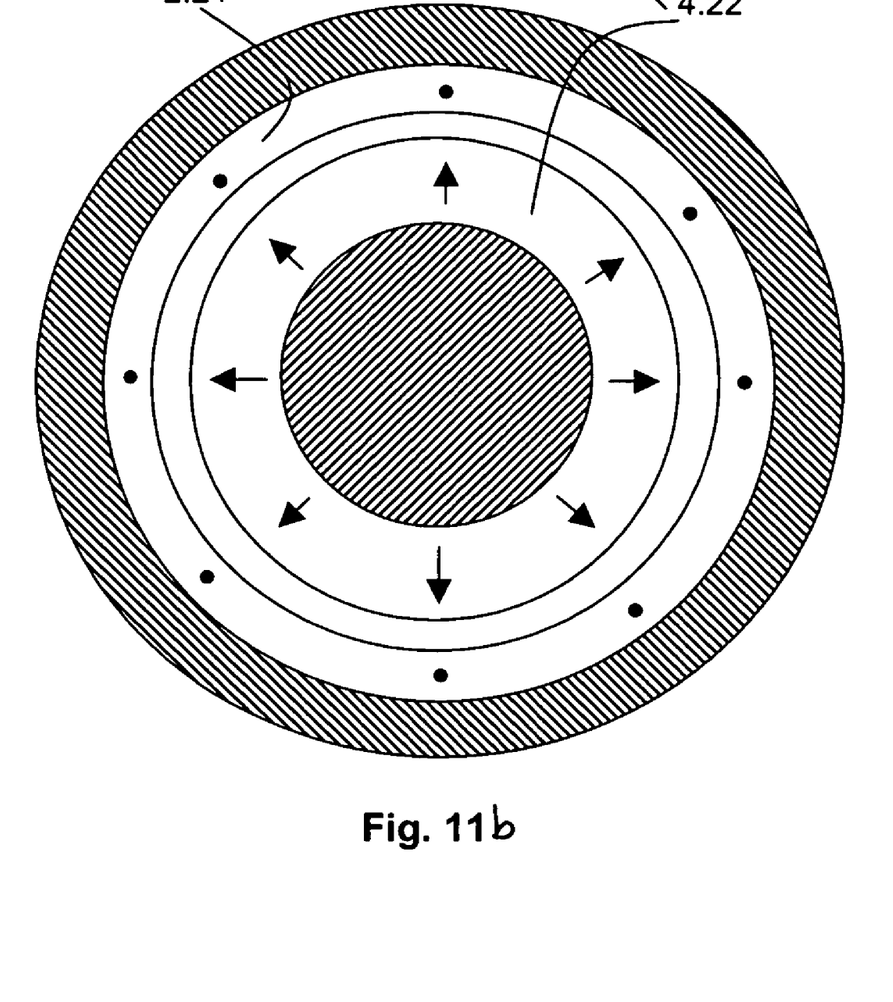

FIGS. 11a and 11b show another arrangement of permanent magnet assemblies according to an exemplary embodiment of the present invention wherein the magnet assemblies have a substantially circular shape. FIG. 11a shows a front view and FIG. 11b shows a top view. In the arrangement shown, the first magnetic assembly includes a magnet 2.24 and the second magnet assembly includes a magnet 4.22. Both circular assemblies are arranged to have the same axis of symmetry. This allows both parts of the bearing to rotate relative to each other around the axis of symmetry. In order to maintain the appropriate relative position between both permanent magnet assemblies, the arrangement shown may further be equipped with one or more actuators. Such actuators may include rotary electromagnetic motors, piezoelectric motors, linear actuators, etc. It should further be noted that each of the arrangements shown in FIGS. 2a–10 may be modified in order to provide a passive magnetic bearing for a substantially circular arrangement.

The passive magnetic bearing can be applied to all components of the lithographic apparatus that require a movable support. Some examples are the use of the passive magnetic bearing between a base frame and a dynamic component such as a support for the patterning device or a substrate table or between a balance mass and a base frame. For example, the passive magnetic bearing may be applied in a positioning device that positions a mask table over comparatively large distances relative to a frame in the scanning direction. In such an arrangement, the positioning device may include a linear motor, the linear motor operating between the mask table and the frame. In such an arrangement, the passive magnetic bearing may also be applied between the mask table and the frame. In general, the positioning device may further be equipped with actuators (e.g. Lorentz actuators) to maintain the mask table in the appropriate position relative to the frame. In order to increase the accuracy of the positioning of the mask table, the positioning device may further be equipped with a short stroke actuator system that accurately positions the mask table relative to, for example, a projection system of the apparatus. The passive magnetic bearing can also be applied to movably support optical elements, such as lenses or mirrors.

While specific embodiments of the present invention have been described above, it will be appreciated that the present invention may be practiced otherwise than as described. The description is not intended to limit the invention.

What is claimed is:

1. A lithographic projection apparatus, comprising:
   a radiation system configured to provide a beam of radiation;
   a support configured to support a patterning device, the patterning device configured to pattern the projection beam according to a desired pattern;
   a substrate table configured to hold a substrate;
   a projection system configured to project the patterned beam onto a target portion of the substrate; and
   a bearing configured to support a first part of the apparatus with respect to a second part of the apparatus in a first direction such that the first part is movable relative to the second part, wherein the bearing comprises a passive magnetic bearing, wherein, in use, the first part is supported by the second part in the first direction such that the first part is movable with respect to the second part in a second direction substantially perpendicular to the first direction and the second part includes a second magnetic assembly that is longer in the second direction than a first magnetic assembly of the first part.

2. A lithographic projection apparatus according to claim 1, wherein each of the first and second magnetic assemblies is provided with a permanent magnet and the magnetic assemblies are arranged for mutual cooperation in such a way that, in use, a repelling force is generated between the first and second assemblies and a substantial part of the magnetic field lines of the permanent magnets of the first and second magnetic assemblies connect the permanent magnet of the first magnetic assembly with the permanent magnet of the second magnetic assembly.

3. A lithographic projection apparatus according to claim 2, wherein the first magnetic assembly comprises a second permanent magnet, the permanent magnets of the first assembly each have their magnetic polarization parallel or anti-parallel to the first direction and define a space between them in a third direction perpendicular to the first and second direction, the permanent magnet of the second magnetic assembly has its polarization substantially anti-parallel to the polarization of the permanent magnets of the first magnetic assembly, and the permanent magnet of the second magnetic assembly is at least partly located in the space.

4. A lithographic projection apparatus according to claim 2, wherein the first magnetic assembly comprises a second permanent magnet, the permanent magnets of the first magnetic assembly have their magnetic polarization parallel or anti-parallel to the first direction and define a space between them in a third direction perpendicular to the first and second direction, the permanent magnet of the second magnetic assembly has its polarization substantially perpendicular to the polarization of the permanent magnets of the first assembly, and the permanent magnet of the second magnetic assembly is at least partly located in the space.

5. A lithographic projection apparatus according to claim 2, wherein the first magnetic assembly comprises a second permanent magnet, the permanent magnets of the first magnetic assembly have their magnetic polarization parallel to each other and define a space between them in a third direction perpendicular to the first and second direction, the second magnetic assembly comprises a second permanent magnet, one permanent magnet of the second magnetic assembly having its polarization substantially parallel to the polarization of the permanent magnets of the first assembly, and the other permanent magnet of the second magnetic assembly having its polarization substantially anti-parallel to the polarization of the permanent magnets of the first magnetic assembly, and the permanent magnets of the second magnetic assembly are at least partly located in the space.

6. A lithographic projection apparatus according to claim 2, wherein the first magnetic assembly comprises a plurality of elongated permanent magnets arranged parallel to each other in the second direction, each pair of adjacent permanent magnets defining a space between them in a third direction substantially perpendicular to the first and second direction, the second magnetic assembly comprises a second permanent magnet, the permanent magnets of the second magnetic assembly are placed adjacent to each other in the third direction, each magnet is at least partly located in one of the spaces defined by two adjacent permanent magnets of the first magnetic assembly, the permanent magnets of the first magnetic assembly have their magnetic polarization substantially parallel or anti-parallel to each other, and the permanent magnets of the second magnetic assembly have their magnetic polarization substantially perpendicular to the magnetic polarization of the permanent magnets of the first magnetic assembly.

7. A lithographic projection apparatus according to claim 2, wherein the second magnetic assembly comprises a plurality of magnets arranged adjacent to each other in the second direction.

8. A lithographic projection apparatus according to claim 2, wherein relative positions of at least two permanent magnets of at least one of the first and second magnetic assemblies are adjustable.

9. A lithographic projection apparatus according to claim 1, wherein the bearing comprises a first magnetic assembly and a second magnetic assembly, the first magnetic assembly comprises at least one permanent magnet and the second magnet assembly comprises at least one permanent magnet, and each magnetic assembly substantially has a circular shape.

10. A lithographic projection apparatus according to claim 9, wherein at least one of the magnetic assemblies comprises two or more permanent magnets, the relative position of the magnets being adjustable.

11. A lithographic apparatus according to claim 1, further comprising a linear motor configured to displace the first part relative to the second part in direction perpendicular to the first direction.

12. A lithographic apparatus according to claim 11, wherein the linear motor comprises a magnet array attached to the second part and a coil assembly attached to the first part.

13. A lithographic apparatus according to claim 11, further comprising a linear actuator configured to generate a force between the first part and the second part in the first direction.

14. A lithographic apparatus according to claim 9, further comprising a plurality of linear actuators configured to position the first part relative to the second part in at least one degree of freedom.

15. A device manufacturing method for use with a lithographic projection apparatus, the method comprising:

projecting a patterned beam of radiation onto a target portion of a substrate at least partially covered by a layer of radiation sensitive material; and supporting a first part of the apparatus with respect to a second part of the apparatus in a first direction such that the first part is movable relative to the second part, wherein the first part is supported with respect to the second part by a passive magnetic bearing, wherein the first part is supported by the second part in the first direction such that the first part is movable with respect to the second part in a second direction substantially perpendicular to the first direction and the second part includes a second magnetic assembly that is longer in the second direction than a first magnetic assembly of the first part.

16. A device manufactured by the method of claim 15.

\* \* \* \* \*